(12) United States Patent
Yin et al.

(10) Patent No.: US 12,212,860 B2
(45) Date of Patent: Jan. 28, 2025

(54) IMAGE SENSOR CIRCUIT AND IMAGE SENSOR DEVICE

(71) Applicant: Guangzhou Tyrafos Semiconductor Technologies Co., Ltd., Guangzhou (CN)

(72) Inventors: Ping-Hung Yin, Hsinchu (TW); Jia-Shyang Wang, Miaoli County (TW); Dean Wang, Taichung (TW)

(73) Assignee: Guangzhou Tyrafos Semiconductor Technologies Co., Ltd., Guangzhou (CN)

( * ) Notice: Subject to any disclaimer, the term of this patent is extended or adjusted under 35 U.S.C. 154(b) by 147 days.

(21) Appl. No.: 18/142,598

(22) Filed: May 3, 2023

(65) Prior Publication Data

US 2023/0388668 A1    Nov. 30, 2023

Related U.S. Application Data

(60) Provisional application No. 63/345,920, filed on May 26, 2022.

(51) Int. Cl.
*H04N 25/10* (2023.01)
*G06T 3/4015* (2024.01)
(Continued)

(52) U.S. Cl.
CPC .......... *H04N 25/10* (2023.01); *G06T 3/4015* (2013.01); *G06T 5/50* (2013.01); *H01L 27/0255* (2013.01); *H01L 27/14605* (2013.01); *H01L 27/14612* (2013.01); *H01L 27/14643* (2013.01); *H04N 23/13* (2023.01); *H04N 23/45* (2023.01); *H04N 23/52* (2023.01); *H04N 23/56* (2023.01); *H04N 23/73* (2023.01); *H04N 23/74* (2023.01); *H04N 23/741* (2023.01); *H04N 23/815* (2023.01); *H04N 23/951* (2023.01); *H04N 25/11* (2023.01); *H04N 25/134* (2023.01); *H04N 25/135* (2023.01); *H04N 25/47* (2023.01);
(Continued)

(58) Field of Classification Search
None
See application file for complete search history.

(56) References Cited

U.S. PATENT DOCUMENTS 9,894,304 B1 *  2/2018  Smith ................ H04N 23/843

* cited by examiner

*Primary Examiner* — Mark T Monk
(74) *Attorney, Agent, or Firm* — Lin & Associates Intellectual Property, Inc.

(57) ABSTRACT

Provided is an image sensor circuit, including a pixel array and a plurality of different control circuits. The pixel array comprises a plurality of pixel circuit groups arranged in an array. Each pixel circuit group comprises a plurality of pixel circuits that generate corresponding sensitivity values over exposure duration. The pixel circuits include a first quantity of first pixel circuits, and a second quantity of second pixel circuits. The plurality of different control circuits are respectively coupled to different pixel circuits to control the exposure duration thereof with different transmission signals. The different control circuits are also set to control different pixel circuits to output photo-sensed values at different frame rates. The image sensor circuit periodically generates the pixel value of each pixel circuit group according to first and second exposure durations, first and second frame rates, and first and second light sensitivity values of each pixel circuit group.

20 Claims, 11 Drawing Sheets

(51) Int. Cl.
*G06T 5/50* (2006.01)
*H01L 27/02* (2006.01)
*H01L 27/146* (2006.01)
*H04N 23/13* (2023.01)
*H04N 23/45* (2023.01)
*H04N 23/52* (2023.01)
*H04N 23/56* (2023.01)
*H04N 23/73* (2023.01)
*H04N 23/74* (2023.01)
*H04N 23/741* (2023.01)
*H04N 23/80* (2023.01)
*H04N 23/951* (2023.01)
*H04N 25/11* (2023.01)
*H04N 25/13* (2023.01)
*H04N 25/47* (2023.01)
*H04N 25/50* (2023.01)
*H04N 25/533* (2023.01)
*H04N 25/535* (2023.01)
*H04N 25/58* (2023.01)
*H04N 25/59* (2023.01)
*H04N 25/75* (2023.01)
*H04N 25/77* (2023.01)
*H04N 25/771* (2023.01)
*H04N 25/78* (2023.01)

(52) U.S. Cl.
CPC ........... *H04N 25/50* (2023.01); *H04N 25/533* (2023.01); *H04N 25/535* (2023.01); *H04N 25/58* (2023.01); *H04N 25/59* (2023.01); *H04N 25/75* (2023.01); *H04N 25/77* (2023.01); *H04N 25/771* (2023.01); *H04N 25/78* (2023.01); *G06T 2207/20208* (2013.01); *G06T 2207/20221* (2013.01)

IMAGE SENSOR CIRCUIT AND IMAGE SENSOR DEVICE

CROSS-REFERENCE TO RELATED APPLICATION

This application claims the priority of U.S. patent application No. 63/345,920, filed on May 26, 2022, which is incorporated herewith by reference.

BACKGROUND OF THE INVENTION

1. Field of the Invention

The present invention relates to an image sensor, particularly to an image sensor device that can simultaneously detect motions and record image video.

2. The Prior Arts

Image sensors are widely used in various fields such as car recorders, surveillance cameras, and digital cameras. The purposes of image sensing can be divided into two main categories: acquiring and recording image data and monitoring real-time motion changes in the image. Different sensing conditions are required for different image sensing purposes. For example, when the purpose of image sensing is to record the image, users usually want to record high-quality and clear full-color images. On the other hand, when the purpose of image sensing is only to monitor whether there are dynamic changes in the image, there is a higher requirement for the sensitivity of object motion changes and a lower requirement for color information. For example, dynamic vision sensors (DVS) have been widely used in various technical fields, such as autonomous driving technology. However, traditional motion detection and image recording are usually implemented by separate sets of sensors or readout circuits, which require double the hardware cost and circuit complexity. Therefore, a technology development for simultaneously achieving both image sensing technologies at a lower hardware cost is a challenge that needs to be addressed.

SUMMARY OF THE INVENTION

In view of the, the present invention proposes an implementation of an image sensor circuit that can perform both motion detection and image recording functions. The image sensor circuit of the present invention comprises at least one pixel array and a driver circuit. The pixel array is configured to sense light and generate image data, comprising a plurality of pixel circuit groups arranged in an array. Each of the pixel circuit groups comprises multiple pixel circuits that are configured to generate corresponding photo-sensed values according to the exposure duration. The pixel circuits comprise a first quantity of first pixel circuits and a second quantity of second pixel circuits. The driver circuit is coupled to the pixel circuit groups and is used to drive the pixel circuit groups, comprising a first control circuit and a second control circuit. The first control circuit is coupled to the first pixel circuits, transmitting a first transmission signal to control a first exposure duration of the first pixel circuits. The second control circuit is coupled to the second pixel circuits, transmitting a second transmission signal to control a second exposure duration of the second pixel circuits. The first control circuit is also configured to control the first pixel circuits to output a first photo-sensed value at a first frame rate. The second control circuit is also configured to control the second pixel circuits to output a second photo-sensed value at a second frame rate, which can be higher than twice the first frame rate. However, the present invention is not limited to the. The image sensor circuit periodically generates pixel values of each pixel circuit group based on the first exposure duration, the second exposure duration, the first frame rate, the second frame rate, the first photo-sensed value, and the second photo-sensed value of each pixel circuit group.

When the image sensor circuit generates the pixel values for each of the pixel circuit groups, a plurality of photo-sensed values generated by the first pixel circuits are multiplied with corresponding weight coefficients to be summed up into the first photo-sensed value. The plurality of photo-sensed values generated by the second pixel circuit are also multiplied by corresponding specific weight coefficients and summed up to obtain the second photo-sensed value.

The image sensor circuit of the present invention may further comprise a readout circuit. The readout circuit is coupled to each of the pixel circuit groups and is configured to read the photo-sensed values from each of the pixel circuits. The first and second control circuits can control the readout circuit in a time-division manner via a reset signal, so that the readout circuit generates a readout signal based on the photo-sensed values of each pixel circuit.

In a further embodiment, each of the pixel circuits in the pixel circuit group of the image sensor circuit comprises a photodiode and a switch circuit. The photodiode is photo-sensitive and accumulates charge. The switch circuit is coupled to the photodiode PD and the floating diffusion node FD. The floating diffusion node FD is coupled to the ramp capacitor Cr and can change its conductivity under the control of the driver circuit. When the first control circuit sends a first transmission signal to turn on the switch circuit in a first pixel circuit and sends a reset signal to reset the switch circuit to a reset voltage, the accumulated charges in a photodiode of the first pixel circuit is reset. When the first control circuit sends the first transmission signal to turn on the switch circuit, but does not send the reset signal, the accumulated charges in the photodiode of the first pixel circuit is coupled to the floating diffusion node.

In a further embodiment, the driver circuit further comprises a third control circuit, coupled to the pixel circuit groups, and transmits a third transmission signal to expose a third quantity of third pixel circuits in the pixel circuit groups for a third exposure duration. The third control circuit is also configured to control the third pixel circuits to output a third photo-sensed value at a third frame rate. The image sensor circuit periodically generates corresponding pixel values for each pixel circuit group based on the first photo-sensed value, the second photo-sensed value, and the third photo-sensed value using a specific algorithm.

The present invention also provides an image sensor device for detecting motion and capturing images. In addition to the image sensor circuit described in the previous embodiment, the image sensor device also comprises multiple red filters, green filters, and blue filters respectively covering the first pixel circuits and the second pixel circuits. An analog-to-digital converter is coupled to the image sensor circuit and is set to convert the pixel values output from the first pixel circuits to a first digital signal at a first frame rate, and to convert the pixel values output from the second pixel circuits to a motion sensing signal at a second frame rate. An image processor module is coupled to the analog-to-digital converter and is configured to generate image data based on the first digital signal. A dynamic sensor module is coupled to the analog-to-digital converter and is configured to detect object movements based on the second digital signal.

In summary, the circuit architecture of the present invention has at least the following advantages. The image sensor circuit comprises two control circuits with different frame rates, so that different pixel circuits in the same pixel circuit group can output data with different frame rates. Therefore, the image sensor circuit of the present invention does not need to increase additional pixel circuit groups, but generates two types of data required for divergent functions using the same pixel circuit group, while achieving the functions of recording high-quality images and sensitive detection of motion.

BRIEF DESCRIPTION OF THE DRAWINGS

The drawings shown herein are used to provide a further understanding of the present invention, forming part of the present invention, and the schematic embodiments of the present invention and its description are used to interpret the present invention and do not constitute an improper limitation of the present invention. In the drawings.

DETAILED DESCRIPTION OF THE PREFERRED EMBODIMENT

The following will be combined with the drawings in the embodiment of the present invention, the technical solution in the embodiment of the present invention is clearly and completely described, obviously, the described embodiment is a part of the embodiment of the present invention, not all embodiments. Based on the embodiments in the present invention, all other embodiments obtained by ordinary knowledge of the technical field without performing creative labor are within the scope of protection of the present invention.

Figure 1:
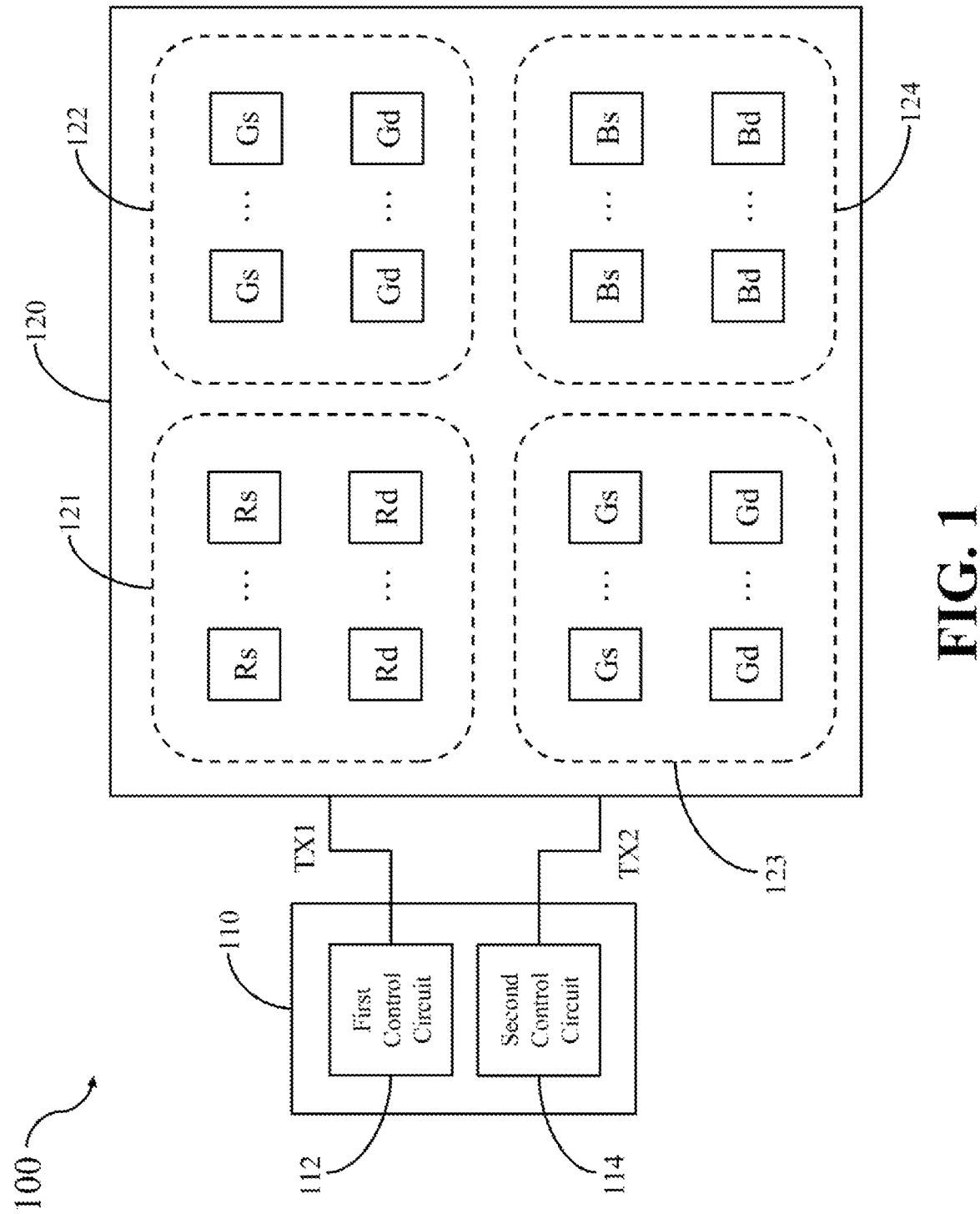
FIG. 1 shows an image sensor circuit architecture according to an embodiment of the present invention.

FIG. 1 is a schematic diagram of the image sensor circuit architecture according to an embodiment of the present invention. The image sensor circuit 100 of the present invention comprises at least one pixel array 120 and a driver circuit 110. The pixel array 120 is configured to sense light and generate image data, comprising multiple pixel circuit groups arranged in an array. Wherein, multiple distinct types of pixel circuit groups, such as the first pixel circuit group 121, the second pixel circuit group 122, the third pixel circuit group 123, and the fourth pixel circuit group 124, can be arranged in the form of a Bayer pixel array, each used to sense red, green, green, and blue. It should be understood that for the sake of illustration, FIG. 1 only shows one first pixel circuit group 121, one second pixel circuit group 122, one third pixel circuit group 123, and one fourth pixel circuit group 124. In practice, the pixel array 120 can comprise multiple first pixel circuit groups 121, multiple second pixel circuit groups 122, multiple third pixel circuit groups 123, and multiple fourth pixel circuit groups 124. On the other hand, the arrangement of each color pixel circuit group within a pixel circuit group is not limited to the order shown in FIG. 1. In one embodiment, the output of distinct types of pixel circuit groups can be read out by a differential signal to increase the sensitivity and reduce noise of image sensing. For example, the first pixel circuit group 121 and the second pixel circuit group 122 can serve as one end of the differential readout circuit, such as the P-side, while the third pixel circuit group 123 and the fourth pixel circuit group 124 can serve as the other end of the differential readout circuit, such as the N-side. The output values of the pixel circuit groups can be processed through subsequent processing (not shown) to obtain the image data.

As shown in FIG. 1, each of the pixel circuit groups contains a plurality of pixel circuits that are designed to generate corresponding light sensitivity values varied with exposure durations. For example, the first pixel circuit group 121 comprises a first quantity of first red pixel circuits Rs and a second quantity of second red pixel circuits Rd. Similarly, the second pixel circuit group 122, the third pixel circuit group 123, and the fourth pixel circuit group 124 also correspondingly comprise first green pixel circuits Gs, second green pixel circuits Gd, first blue pixel circuits Bs, and second blue pixel circuits Bd, operated analogously. Therefore, for the sake of clarity, the following embodiment only describes the first pixel circuit group 121 as an example.

The driver circuit 110 is coupled to the pixel array 120 for driving the pixel circuit group, and includes at least a first control circuit 112 and a second control circuit 114. In the embodiment, the driver circuit 110 can be a chip for controlling the pixel array 120, including but not limited to concepts such as timing control, row driver, and column driver. The followings describe the controlling of the exposure duration and the output frame rate.

To consider the sensitivity of motion detection and the image quality of static scenes, the present embodiment of the invention allows the pixel array 120 to simultaneously generate image data with multiple exposure values. For example, the first control circuit 112 in the driver circuit 110 is coupled to the first quantity of first red pixel circuits Rs, and sends a first transmission signal TX1 to control a first exposure duration of each first red pixel circuit Rs. The second control circuit 114 is coupled to the second quantity of second red pixel circuits Rd and sends a second transmission signal TX2 to control a second exposure duration of the second red pixel circuits Rd. Since different pixel circuits in the pixel array 120 have different exposure durations, the speed of outputting image data is also varied. Typically, detection of dynamic scenes requires a higher frame rate, while recording static scenes does not require high frame rates but a higher signal-to-noise ratio (SNR). Therefore, in the embodiment, the first control circuit 112 can control the first red pixel circuit Rs to output a first photo-sensed value at a first frame rate, while the second control circuit 114 can control the second red pixel circuits Rd to output a second photo-sensed value at a second frame rate. The second frame rate is higher than the first frame rate. It should be noted that the first control circuit 112 and the second control circuit 114 may each have a first address decoder and a second address decoder, respectively, to respectively generate asynchronous first frame rate and second frame rate. Also, it should be noted that since the first transmission signal TX1 and the second transmission signal TX2 are controlled by the first control circuit 112 and the second control circuit 114, respectively, the first exposure duration can be longer than the period of a frame operated at the second frame rate. For example, the driver circuit 110 can control the pixel array 120 to detect dynamic image changes at a speed of 30 frames per second, but at the same time, it can record first digital data at a speed of 1 frame per second. After the first frame data and the second frame data are stored in a frame buffer, the appropriate algorithm can be used to fuse the first frame data and the second frame data to obtain a high SNR image at a speed of 30 frames per second.

In one embodiment, the sum of the first quantity and the second quantity is 4. The first quantity can be 3, and the second quantity can be 1. In another embodiment, the first quantity can be 2, and the second quantity can also be 2. In further derivative embodiments, the sum of the first quantity and the second quantity is not limited to 4, and can be 9 or higher. Therefore, the ratio of the first quantity and the second quantity can be changed as needed in implementation. For example, the ratio of the first quantity and the second quantity can be M:N, where M and N are integers.

The final image data can be generated from the photo-sensed values output from the red first pixel circuit Rs and the red second pixel circuit Rd through appropriate algorithms. For example, the image sensor circuit 100 multiplies the photo-sensed values of the first red pixel circuit Rs and the second red pixel circuits Rd by different gain values, and then adds them up to generate corresponding pixel values. The pixel values of distinct colors can be properly blended to determine the final image data, such as adjusting the balance ratio of the three colors according to the white balance algorithm. In other words, each pixel circuit can correspond to different specific weighting coefficients. The photo-sensed values of multiple different pixel circuits are multiplied by the corresponding specific weighting coefficients and then added up to generate corresponding pixel values. However, the present invention is not limited to the.

In other words, the pixel array 120 in the embodiment is designed to include multiple distinct types of pixel circuit groups. Each pixel circuit in the pixel circuit group can be equipped with different types of filters (not shown) to sense corresponding types of light, thus producing the first pixel circuit group 121, the second pixel circuit group 122, the third pixel circuit group 123, and the fourth pixel circuit group 124. Generally, the image data can be processed to become a video file with a frame rate of 30 frames per second (FPS). The embodiment is adaptable for low-light motion monitoring. Toi improve the image quality of low-light motion detection, the second control circuit 114 can record dynamic images to avoid motion blur, and the first control circuit 112 can lengthen the exposure duration of some pixel circuits in the pixel array 120, reduce the gain value, and lower the frame rate to significantly increase the signal-to-noise (SNR) ratio. By properly fusing the image data of the first and second frames using appropriate algorithms, an image with high SNR ratio and no motion blur can be obtained.

Figure 2:
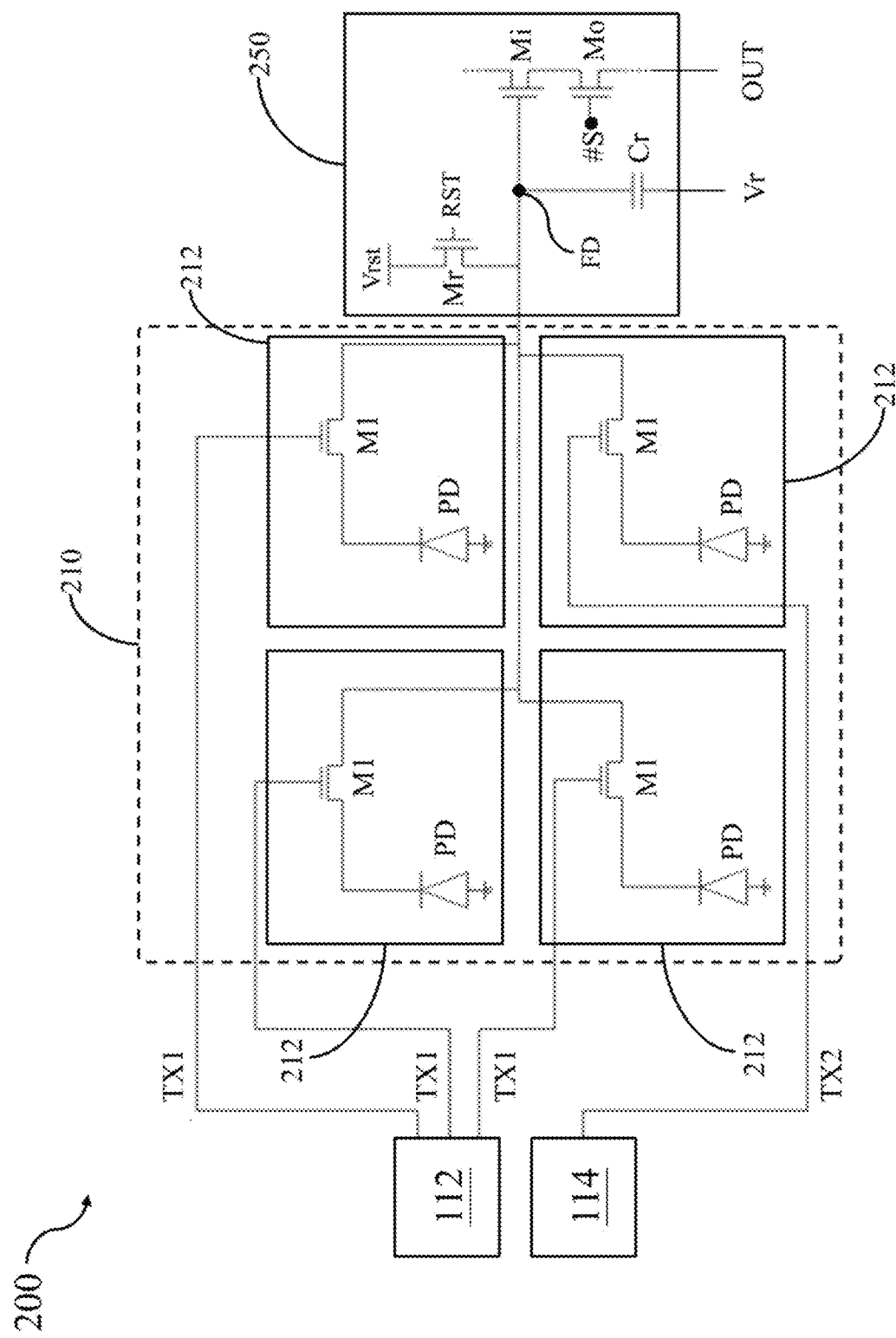
FIG. 2 shows an image sensor circuit according to an embodiment of the present invention.

FIG. 2 shows an image sensor circuit according to an embodiment of the present invention. Four pixel circuits 212 are illustrated in the embodiment of FIG. 2, which are used to sense light and generate signals. The image sensor circuit 100 further includes a readout circuit 250, which is coupled to the output ends of each pixel circuit 212. The readout circuit 250 is controlled by a reset signal RST and operates according to a specific timing to read the values output from the corresponding pixel circuit. For example, in the embodiment, the pixel circuit group 210 can be configured to use three pixel circuits 212 to sense static images and one pixel circuit 212 to sense dynamic images. As shown in FIG. 2, the first control circuit 112 sends a first transmission signal TX1 to control the three pixel circuits 212 in the pixel circuit group 210 to output the first output data at the first frame rate, and the second control circuit 114 controls the fourth pixel circuit 212 to output the second output data at the second frame rate. The first transmission signal TX1 sent by the first control circuit 112 and the second transmission signal TX2 sent by the second control circuit 114 can control the exposure output timing and reset timing of the corresponding pixel circuit 212. It should be noted that FIG. 2 only illustrates one readout circuit 250 shared by multiple pixel circuits 212, which is particularly adaptable for pixel binning mode operations and can obtain lower noise and higher SNR, making it adaptable for image sensing in low light conditions. Furthermore, although FIG. 2 only illustrates one readout circuit 250 shared by multiple pixel circuits 212, it is not limited to the in practice. For example, the image sensor circuit 200 may also set up corresponding readout circuits 250 for distinct types of pixel circuits 212 to simplify the timing arrangement for reading output values.

The embodiment of FIG. 2 is adaptable for operation with a rolling shutter. The scan signal #S scans each row of pixel array 120 in turn. Only the pixel circuit group in the row opened by the scan signal #S will perform the data readout operation at the same time. The structure of the rolling shutter belongs to the known art, and therefore the basic introduction is omitted.

In the embodiment of FIG. 2, the readout circuit 250 includes a ramp capacitor Cr. The first end of the ramp capacitor Cr is coupled to the output terminal of each pixel circuit 212 in the pixel circuit group 210, where it can receive and store the output data of the pixel circuit 212 at the corresponding timing. The second end of the ramp capacitor Cr is connected to a ramp voltage Vr. When the readout circuit 250 is controlled by a scan signal #S, the ramp capacitor Cr can be coupled to the ramp voltage to convert the potential stored in the floating diffusion node FD into a readout signal OUT according to a specific timing. The readout circuit 250 may include an input switch Mi and an output switch Mo. When the input switch Mi is turned on and the scan signal #S opens the output switch Mo, the readout circuit 250 reads out the signal OUT from the drain of the output switch Mo. On the other hand, the floating diffusion node FD is also reset by a reset signal RST. For example, the readout circuit 250 is coupled to a reset voltage Vrst through a reset switch Mr. When the reset signal RST is connected to the switch, the potential value on the floating diffusion node FD is pulled to the reset voltage Vrst. Therefore, the reset signal RST, together with the first transmission signal TX1 and the second transmission signal TX2 output by the first control circuit 112 and the second control circuit 114, respectively, allows the readout circuit 250 to sequentially read out the photo-sensed values output by each pixel circuit 212 in an orderly manner. The design of the readout circuit 250 can vary with actual product development. The reset voltage Vrst can be 0V or a voltage with diverse levels. The ramp voltage Vr can be an upward continuous changing voltage or a downward continuous changing voltage. The embodiment of the present invention is not limited to that shown in FIG. 2.

In FIG. 2, the first control circuit 112 and second control circuit 114 control the timing of the first transmission signal TX1, the second transmission signal TX2, and the reset signal RST to convert the photo-sensed values output by each pixel circuit 212 to a readout signal OUT in a specific timing sequence. In the implementation of FIG. 2, the pixel circuit group 210 can be used to represent any of the first pixel circuit group 121, the second pixel circuit group 122, the third pixel circuit group 123, or the fourth pixel circuit group 124 in FIG. 1. Each pixel circuit 212 includes at least one photodiode PD and a switch circuit M1. One end of the photodiode PD is coupled to the ground, and the other end is coupled to the switch circuit M1, which can accumulate charge by photo sensing. The switch circuit M1 can be a common transistor or semiconductor, with a source and drain that are respectively coupled to the photodiode PD and floating diffusion node FD. The gate of the switch circuit M1 is coupled to the first control circuit 112 or second control circuit 114 and is controlled to be conductive. When the switch circuit M1 is conductive, it can function as a signal transmitter.

Taking the operation of the first control circuit 112 as an example, the following describes an implementation of the signal operation when the photodiode PD in the pixel circuit 212 is reset. When the first control circuit 112 sends the first transmission signal TX1 to turn on the switch circuit M1 and sends a reset signal RST to turn on the reset switch Mr, the switch circuit M1 is turned on to a reset voltage Vrst, causing the accumulated charge in the photodiode PD to be reset to the reset voltage Vrst. It can be understood that the reset voltage Vrst can be a voltage level, which can be a zero or high voltage signal depending on the implementation. The second control circuit 114 also controls the pixel circuit 212 through the second transmission signal TX2 in an analogous way and will not be repeated here.

The following is an example of the signal operation when the photodiode PD is read out, using the operation of the first control circuit 112 as an example. When the first control circuit 112 sends the first transmission signal TX1 to turn on the switching circuit M1, but the reset switch Mr is not turned on by the reset signal RST, the accumulated charge in the photodiode PD generates a photo-sensed value, which is stored in the floating diffusion node FD. When the readout circuit 250 is triggered by the scan signal #S, the readout circuit 250 outputs the photo-sensed value stored in the floating diffusion node FD through the input switch Mi and the output switch Mo as the readout signal OUT. In one embodiment, the photo-sensed values sensed by multiple pixel circuits 212 can be read out by the readout circuit 250 simultaneously through the control of the first transmission signal TX1, for example in the pixel binning mode. The readout signal OUT will be used for subsequent image-related signal processing, the details of which are mainly based on conventional techniques and will not be described in detail in the embodiment. The operation of the second control circuit 114 to control the pixel circuit 212 through the second transmission signal TX2 is also the same and will not be repeated here.

In summary, in the present embodiment, the first control circuit 112 and the second control circuit 114 can utilize the timing of manipulating the first transmission signal TX1 and the second transmission signal TX2, as well as the timing of the reset signal RST, to output data at different frame rates without significantly increasing the hardware of the pixel array 120, and to adapt to at least two different image uses. It can be understood that the aforementioned switch circuit M1, input switch Mi, output switch Mo, and reset switch Mr can be implemented by distinct types of transistors. The present embodiment does not limit specific implementation methods.

In the embodiment, the three pixel circuits 212 controlled by the first transmission signal TX1 of the first control circuit 112 perform the same functions as the first red pixel circuit Rs, the first green pixel circuit Gs, or the first blue pixel circuit Bs shown in FIG. 1, and are used to specifically sense static images. Conversely, the pixel circuit 212 controlled by the second transmission signal TX2 of the second control circuit 114 performs the same functions as the second red pixel circuit Rd, the second green pixel circuit Gd, or the second blue pixel circuit Bd shown in FIG. 1, and is used to specifically sense dynamic images. The first control circuit 112 and the second control circuit 114 alternatively employ the two transmission signals, the scanning signal #S, and reset signal RST described in FIG. 2 to control the data sensed by each pixel circuit to be output as a readout signal OUT to the subsequent processing unit through the conversion of the readout circuit 250. That is, the first control circuit 112 and the second control circuit 114 can co-work in a time-divisional manner. The signal operation timing of the image sensor circuit 200 is illustrated in FIG. 3 below.

Figure 3:
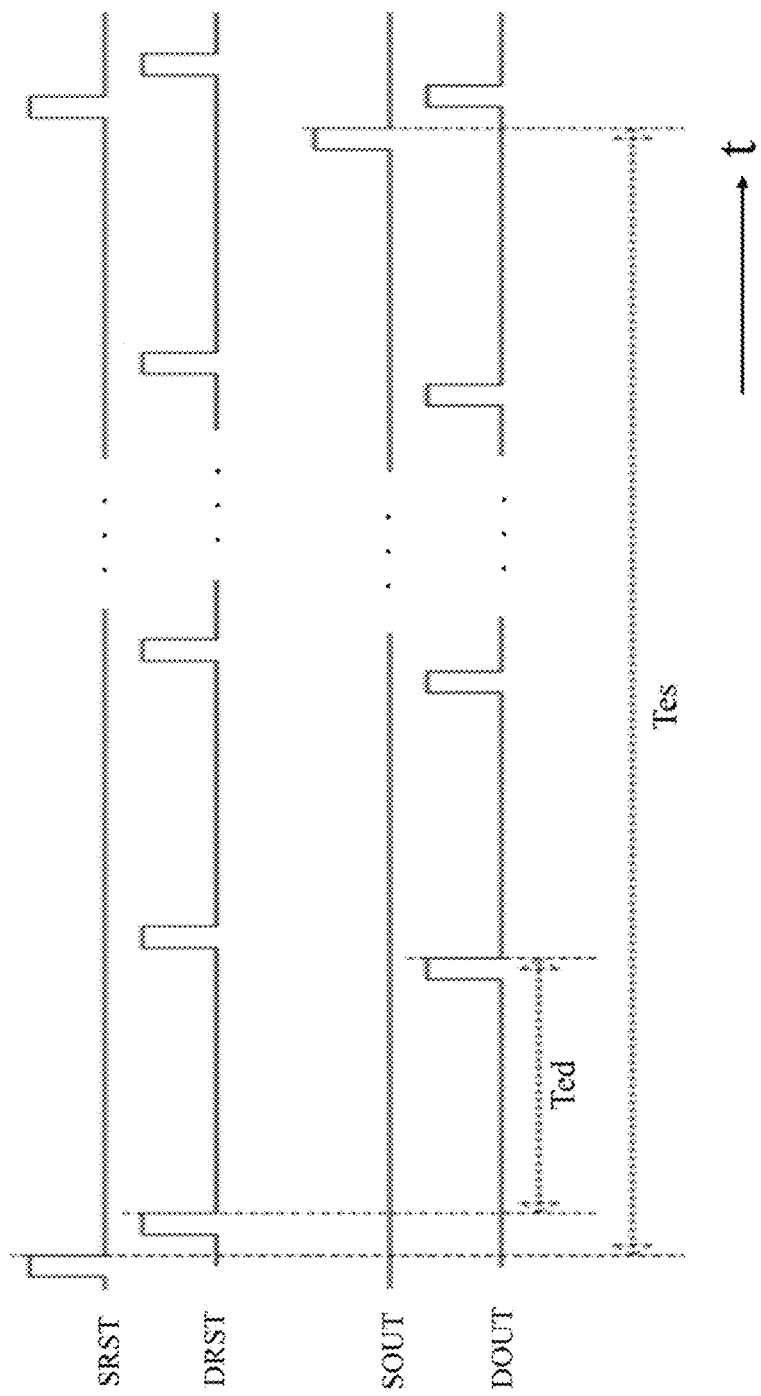
FIG. 3 shows a schematic diagram of the operation timing of the image sensor circuit according to an embodiment of the present invention.

FIG. 3 is a timing diagram illustrating the operation of the sensor circuit according to an embodiment of the present invention. The horizontal axis represents time t. The four pixel circuits 212 in the pixel circuit group 210 of FIG. 2 are defined as two types of functions based on the different transmission signals received, hereafter referred as a static pixel circuit and a dynamic pixel circuit. The time at which the static pixel circuit is reset is represented by SRST, and the time at which the dynamic pixel circuit is reset is represented by DRST. The time at which the static pixel circuit is read out is represented by SOUT, and the time at which the dynamic pixel circuit is read out is represented by DOUT. The exposure duration for each pixel circuit can be calculated from the end of the reset to the readout time. Therefore, the exposure durations for the static and dynamic pixel circuits are represented by Tes and Ted, respectively. From FIG. 3, it can be seen that the exposure duration for the dynamic pixel circuit Ted is set to be shorter, and the output frame rate is higher. Within one exposure duration Tes of the static pixel circuit, the dynamic pixel circuit can perform multiple short exposures and output the accumulated charge. The ratio of the frame rates of the two types of pixel circuits can be any ratio depending on the implementation requirements, such as M:N, where M and N are integers.

In another embodiment, the static pixel circuit and dynamic pixel circuit in the pixel circuit group 210 of the present invention may have different exposure durations, but the data therefrom can be read out simultaneously.

In another derivative embodiment, the exposure duration of the static pixel circuit in the pixel set may be longer than a frame length in the dynamic pixel circuit.

Figure 4:
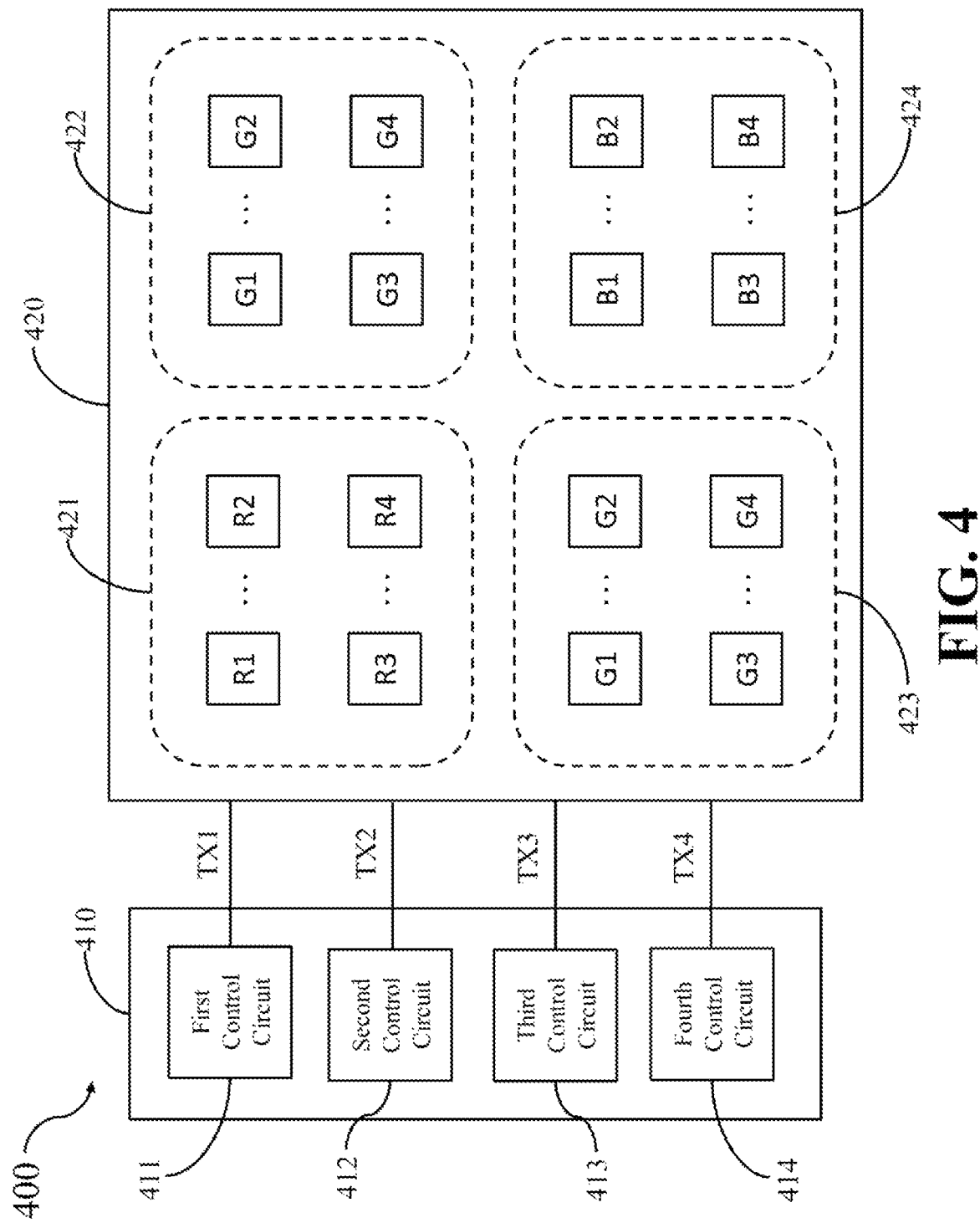
FIG. 4 shows an image sensor circuit according to another embodiment of the present invention.

FIG. 4 shows a schematic diagram of the sensor circuit structure according to another embodiment in the present invention. The image sensor circuit 400 in FIG. 4 can be a derivative of the image sensor circuit 100 in FIG. 1. The driver circuit 110 is replaced by a driver circuit 410, which provides four independent control circuits, namely, the first control circuit 411, the second control circuit 412, the third control circuit 413, and the fourth control circuit 414. Each control circuit is used to control different pixel circuits in each pixel circuit group in the pixel array 120, respectively, by using the first transmission signal TX1, the second transmission signal TX2, the third transmission signal TX3, and the fourth transmission signal TX4. Therefore, the pixel circuits in the pixel array 120 can be set for multiple exposure settings in different ranges, which is conducive to further achieving High Dynamic Range (HDR) image sensing technology.

In FIG. 4, the image sensor circuit 400 is another embodiment derived from the image sensor circuit 100 in FIG. 1. In the embodiment, the driver circuit 110 is replaced by the driver circuit 410, which provides four independent control circuits: the first control circuit 411, the second control circuit 412, the third control circuit 413, and the fourth control circuit 414, each controlling different pixel circuits in each pixel circuit group in the pixel array 120 via the first transmission signal TX1, the second transmission signal TX2, the third transmission signal TX3, and the fourth transmission signal TX4, respectively. Therefore, the pixel circuits in the pixel array 120 can be set to be applicable to multiple exposure settings for achieving high dynamic range (HDR) image sensing technology. In particular, the pixel circuits coupled to the first control circuit 411 are represented by R1, G1, and B1, and the corresponding numbers of pixel circuits coupled to the second, third, and fourth control circuits, represented by R2, G2, B2, R3, G3, B3, R4, G4, and B4, respectively, in the first pixel circuit group 421. The number of pixel circuits in the other pixel circuit groups, namely, the second pixel circuit group 422, the third pixel circuit group 423, and the fourth pixel circuit group 424, is similar to that in the first pixel circuit group 421, and is not described again here.

Taking the first pixel circuit group 421 as an example, the first control circuit 411 is coupled to the corresponding pixel circuit Rs, and a first transmission signal TX1 is transmitted to control the first exposure duration of the pixel circuit Rs. The second control circuit 412 is coupled to the pixel circuit R2 and a second transmission signal TX2 is transmitted to control the second exposure duration of the pixel circuit R2. The third control circuit 413 is coupled to the pixel circuit R3, and a third transmission signal TX3 is transmitted to control the third exposure duration of the pixel circuit R3. The fourth control circuit 414 is coupled to the pixel circuit R4 and a fourth transmission signal TX4 is transmitted to control the fourth exposure duration of the pixel circuit R4. The control methods for corresponding pixel circuits in the second pixel circuit group 422, the third pixel circuit group 423, and the fourth pixel circuit group 424 are generally the same as those in the first pixel circuit group 421 and will not be repeated herein.

In control of the output frame rate, the embodiment of FIG. 4 can produce image signals with four different frame rates from a pixel array 420. The first control circuit 411 can also control the pixel circuits R1, G1, B1 to output a first photo-sensed value at a first frame rate; the second control circuit 412 can also control the pixel circuits R2, G2, B2 to output a second photo-sensed value at a second frame rate; the third control circuit 413 can also control the pixel circuits R3, G3, B3 to output a third photo-sensed value at a third frame rate; and the fourth control circuit 414 can also control the pixel circuits R4, G4, B4 to output a fourth photo-sensed value at a fourth frame rate. The image sensor circuit 400 of the embodiment can periodically fuse the first photo-sensed value, the second photo-sensed value, the third photo-sensed value, and the fourth photo-sensed value output from each pixel circuit group using a specific algorithm to generate corresponding pixel values.

Figure 5:
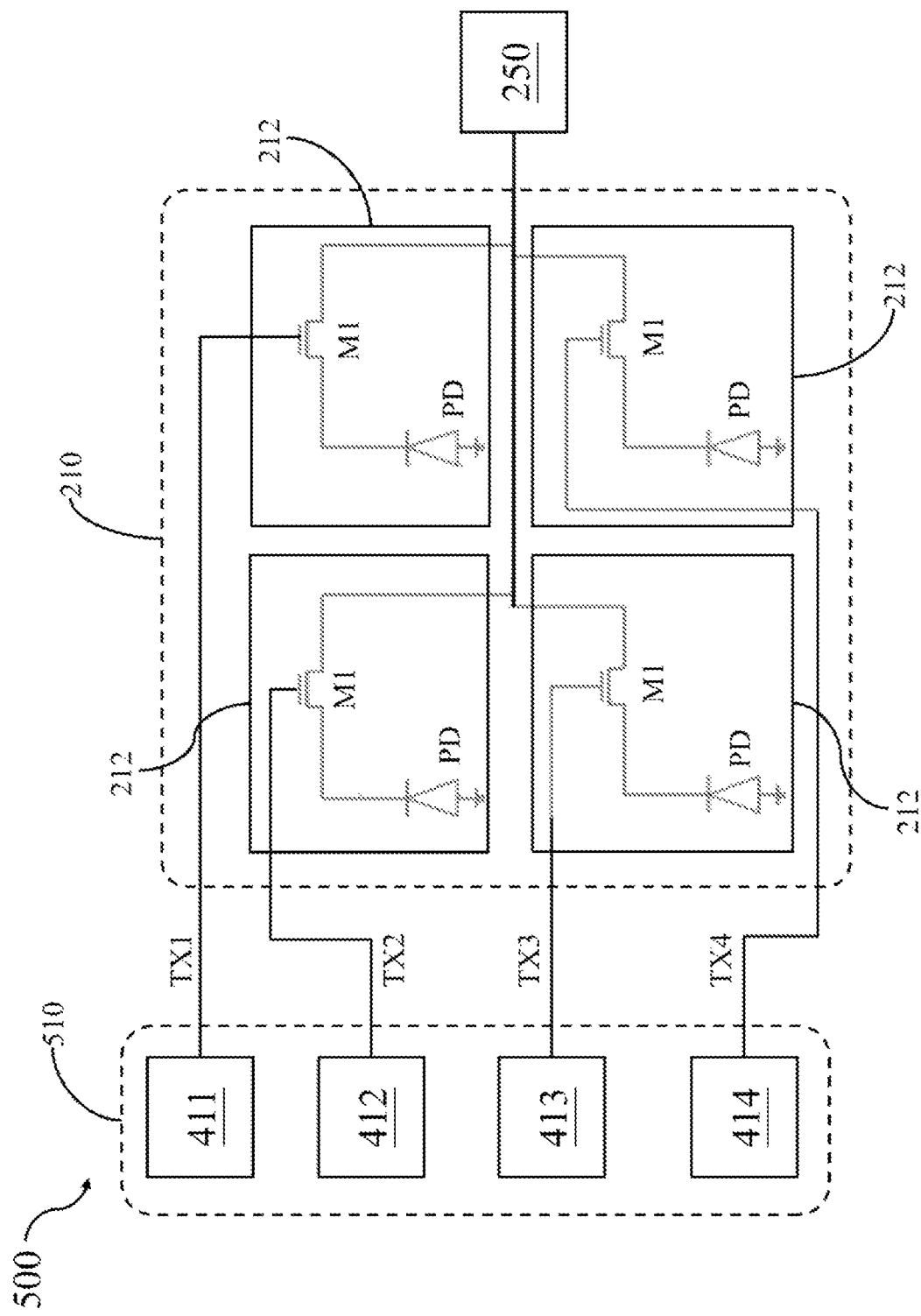
FIG. 5 shows an image sensor circuit according to another embodiment of the present invention.

FIG. 5 shows an image sensor circuit 500 according to a specific implementation of the present invention, based on the implementation of FIG. 4. The circuit structure of the pixel circuit group 210, the pixel circuit 212, and the readout circuit 250 is similar to that of the implementation example in FIG. 2. The pixel circuit group 210 is functionally equivalent to one of the first pixel circuit group 421, the second pixel circuit group 422, the third pixel circuit group 423, or the fourth pixel circuit group 424 in the pixel array 420 of FIG. 4. For example, the first quantity, second quantity, third quantity, and fourth quantity in the pixel array 420 of FIG. 4 can be set to a minimum of 1 to form the pixel circuit group 210 in FIG. 5. The pixel circuit 212 coupled with the first control circuit 411 is equivalent to a red, green, or blue pixel circuit R1, G1, or B1. The pixel circuit 212 coupled with the second control circuit 412 is equivalent to a red, green, or blue pixel circuit R2, G2, or B2. The pixel circuit 212 coupled with the third control circuit 413 is equivalent to a red, green, or blue pixel circuit R3, G3, or B3. The pixel circuit 212 coupled with the fourth control circuit 414 is equivalent to a red pixel circuit R4, green pixel circuit G4, or blue pixel circuit B4.

From the design of FIG. 5, it can be seen that the pixel circuit in a pixel circuit group 210 is controlled by four independent signals, which distinguish the pixel circuits into four distinct functions. By appropriately designing the control circuit, the exposure duration and output frame rate of these pixel circuits can correspond to various levels, so that the image sensor circuit 500 can achieve a balance in aspects such as image quality improvement, motion detection sensitivity, and dynamic range. It should be understood that although FIG. 5 only shows one readout circuit 250 shared by multiple pixel circuits 212, this is not limited in implementation. For example, the image sensor circuit 500 can also set corresponding readout circuits 250 for distinct types of pixel circuits 212 to simplify the timing arrangement for output value reading.

Figure 6:
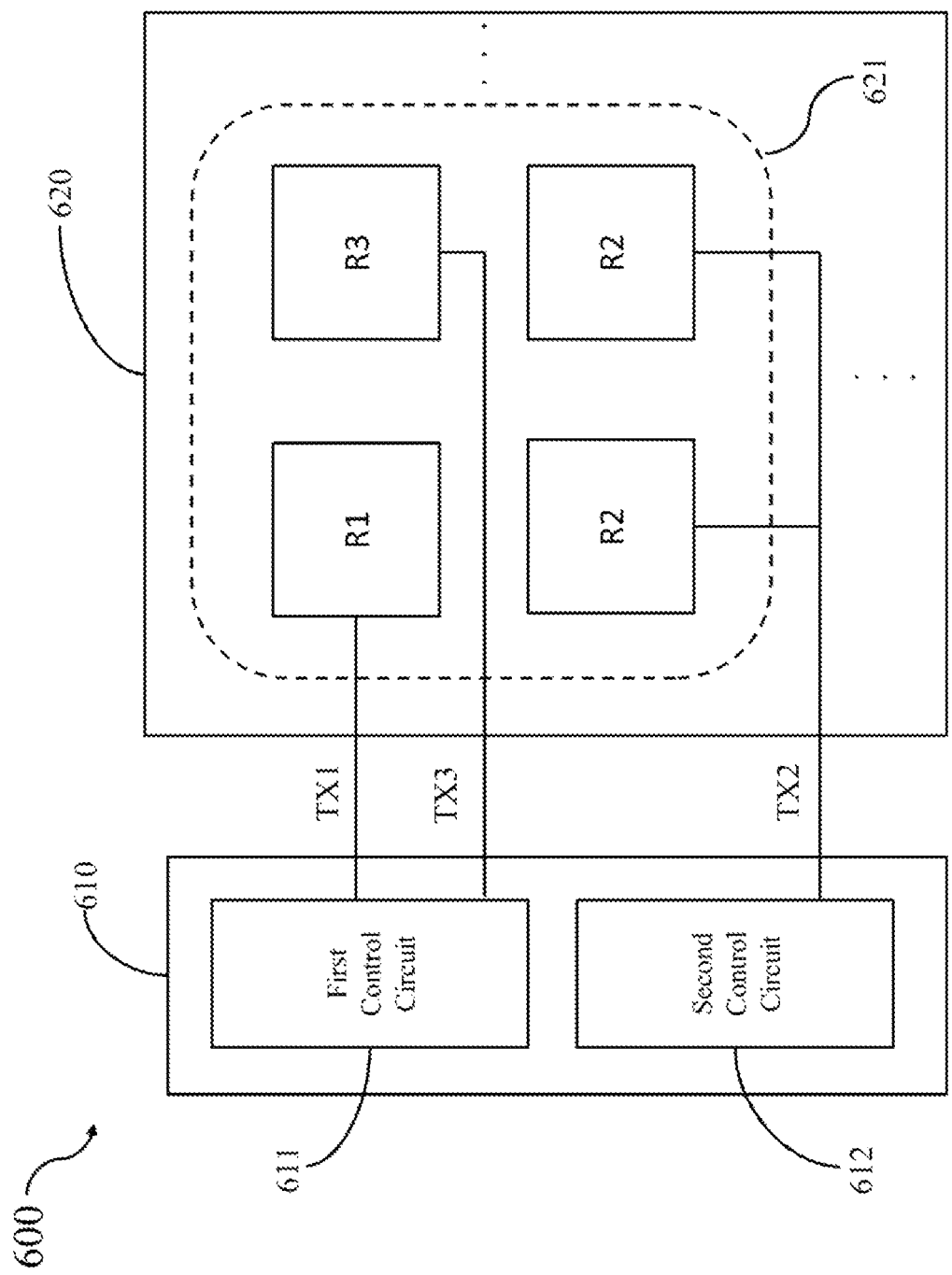
FIG. 6 shows an image sensor circuit according to another embodiment of the present invention.

FIG. 6 is another embodiment of the image sensor circuit. The image sensor circuit 600 in FIG. 6 is similar to the embodiment in FIG. 1, and includes at least one driver circuit 610 and one pixel array 620. The pixel array 620 contains at least three distinct colors of pixel circuit groups. For the sake of illustration, FIG. 6 only shows the first pixel array 621 used for sensing red. For example, each first pixel array 621 in the pixel array 620 can include a first quantity of pixel circuits R1, a second quantity of pixel circuits R2, and a third quantity of pixel circuits R3. In the embodiment of FIG. 6, the first quantity is 1, the second quantity is 2, and the third quantity is 1. The pixel circuit R1 is controlled by the first transmission signal TX1 of the first control circuit 611, the pixel circuit R2 is controlled by the second transmission signal TX2 of the second control circuit 612, and the pixel circuit R3 is controlled by the third transmission signal TX3 of the first control circuit 611.

From the design of FIG. 6, it can be seen that a pixel circuit in a pixel array 620 is controlled by three independent signals, which determine three different pixel circuit functions. The first transmission signal TX1 and the third transmission signal TX3 are provided by the first control circuit 611, while the second transmission signal TX2 is provided by the second control circuit 612. It should be noted that the first and third transmission signals are provided by the same TX3 first control circuit 611, so they have the same frame rate. The second transmission signal TX2 is provided by the second control circuit 612, so it can have a different frame rate. The embodiment of FIG. 6 is intended to illustrate that each control circuit can generate multiple switching control signals for different pixel circuits, achieving an operation mode of the same frame rate but readout in a time-division manner. It can also generate a control signal for multiple pixel circuits to achieve a pixel merging mode. In some contexts, the design is particularly suitable. For example, the first transmission signal TX1 and the third transmission signal TX3 can have the same frame rate but a specific shift relationship in time. In the way, when the pixel circuits R1 and R3 are respectively driven by the first transmission signal TX1 and the third transmission signal TX3, readout timing conflicts can be avoided.

Figure 7:
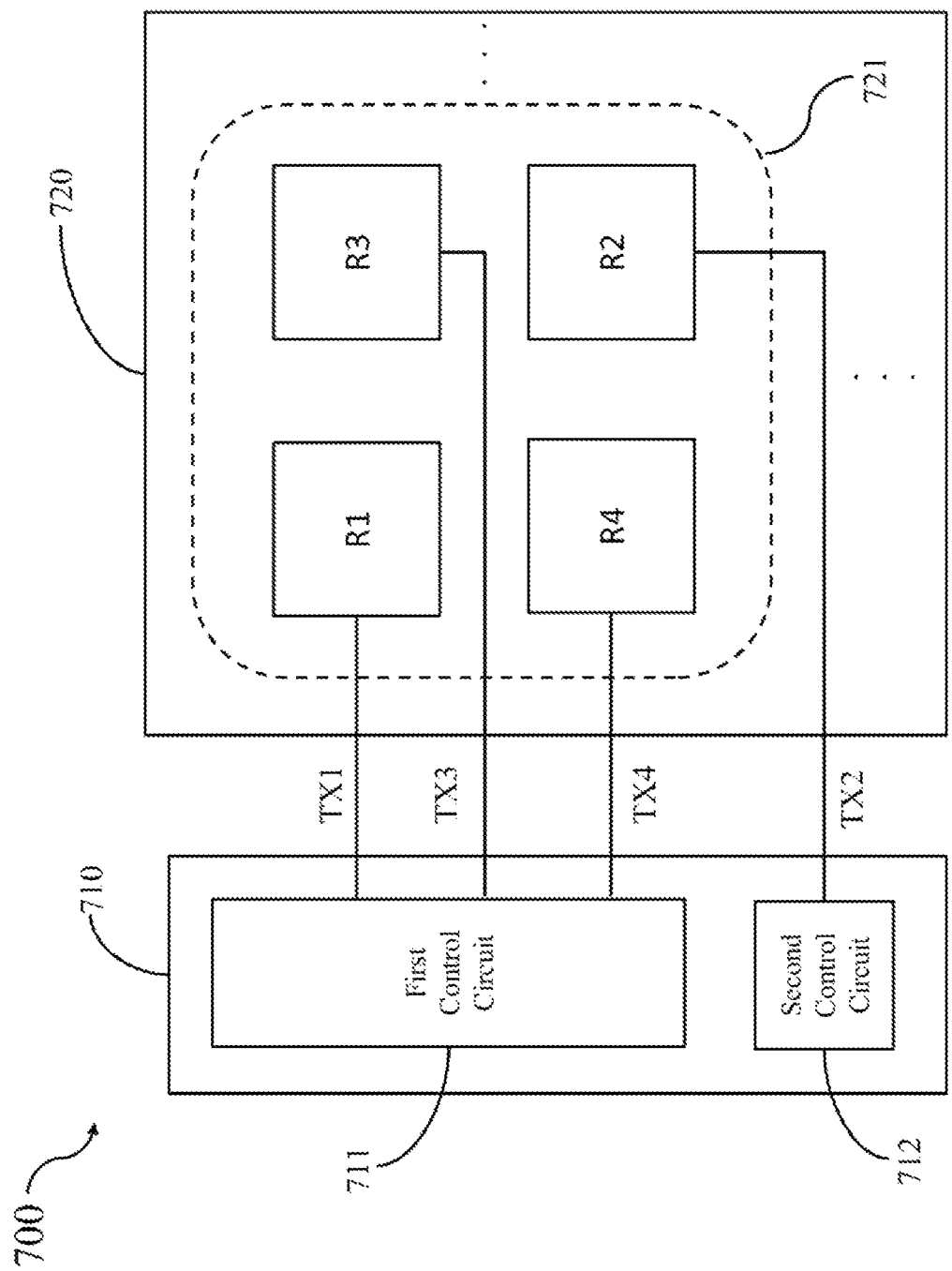
FIG. 7 shows an image sensor circuit according to another embodiment of the present invention.

FIG. 7 shows another embodiment of the image sensor circuit. The image sensor circuit 700 in FIG. 7 is similar to the embodiment shown in FIG. 6, and includes at least one driver circuit 710 and one pixel array 720. For ease of explanation, FIG. 7 only shows the first pixel circuit group 721 used to sense the color red. For example, each first pixel circuit group 721 in the pixel array 720 may include a first quantity of pixel circuits R1, a second quantity of pixel circuits R2, a third quantity of pixel circuits R3, and a fourth quantity of pixel circuits R4. In the embodiment of FIG. 7, the first quantity is 1, the second quantity is 1, the third quantity is 1, and the fourth quantity is 1. The pixel circuit R1 is controlled by the first transmission signal TX1 of the first control circuit 711, the pixel circuit R2 is controlled by the second transmission signal TX2 of the second control circuit 712, the pixel circuit R3 is controlled by the third transmission signal TX3 of the first control circuit 711, and the pixel circuit R4 is controlled by the fourth transmission signal TX4 of the first control circuit 711.

From the design of FIG. 7, it can be seen that the pixel circuit in the pixel array 720 is controlled by two control circuits and can distinguish four different pixel circuit types. Wherein, the first transmission signal TX1, the third transmission signal TX3, and the fourth transmission signal TX4 are provided by the first control circuit 711, and the second transmission signal TX2 is provided by the second control circuit 712. What this embodiment intends to express is that the driver circuit 710 can be designed to include multiple levels of control circuits. For example, the first control circuit 711 is a high-level control circuit that can generate multiple different transmission signals, while the second control circuit 712 is a simple control circuit that can only generate a single fixed transmission signal. By doing so, when designing a product, it can be flexibly configured according to implementation requirements to improve functional flexibility and reduce costs.

Figure 8:
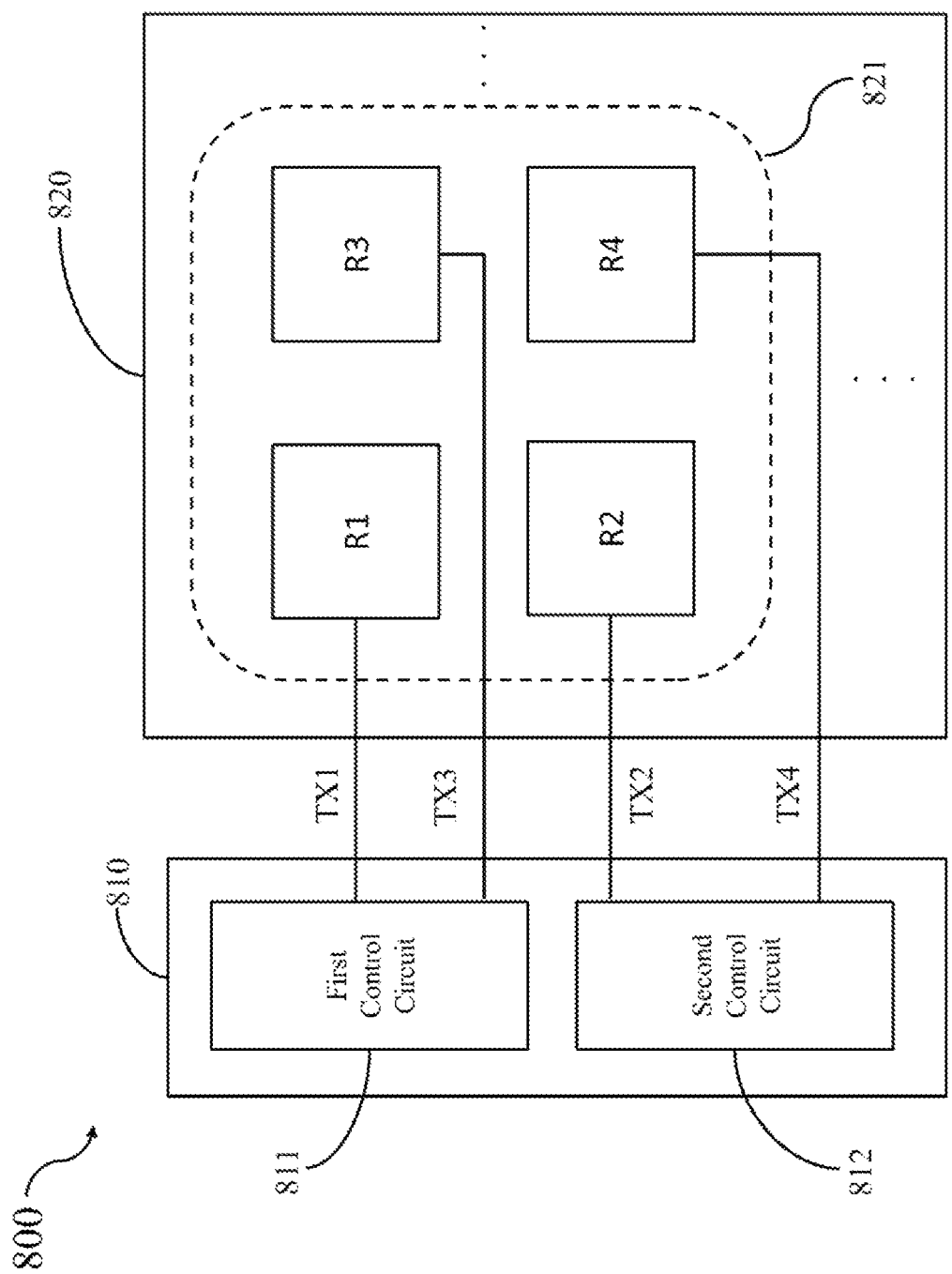
FIG. 8 shows an image sensor circuit according to another embodiment of the present invention.

FIG. 8 shows an image sensor circuit 800 according to another embodiment of the present invention. The image sensor circuit 800 of FIG. 8 is a further derivation of the embodiment of FIG. 7, and includes at least one driver circuit 810 and a pixel array 820. For ease of explanation, FIG. 8 only illustrates the first pixel circuit group 821 as an example. For example, each first pixel circuit group 821 in the pixel array 820 may include a first quantity of pixel circuits R1, a second quantity of pixel circuits R2, a third quantity of pixel circuits R3, and a fourth quantity of pixel circuits R4. In the embodiment of FIG. 8, the first quantity is 1, the second quantity is 1, the third quantity is 1, and the fourth quantity is 1. The pixel circuit R1 is controlled by the first transmission signal TX1 of the first control circuit 811, the pixel circuit R2 is controlled by the second transmission signal TX2 of the second control circuit 812, the pixel circuit R3 is controlled by the third transmission signal TX3 of the first control circuit 811, and the pixel circuit R4 is controlled by the fourth transmission signal TX4 of the second control circuit 812.

From the design of FIG. 8, it can be seen that a pixel circuit in the pixel array 820 is controlled by two control circuits and can be distinguished into four different functional pixel circuits. Specifically, the first transmission signal TX1 and the third transmission signal TX3 are provided by the first control circuit 811, while the second transmission signal TX2 and the fourth transmission signal TX4 are provided by the second control circuit 812. The embodiment aims to express that the driver circuit 810 can be designed as a collection of multiple multi-functional control circuits. Each control circuit can generate multiple different transmission signals, each controlling the corresponding number of pixel circuits. With such design, the product can be flexibly configured according to implementation needs to improve functionality and reduce costs.

Figure 9:
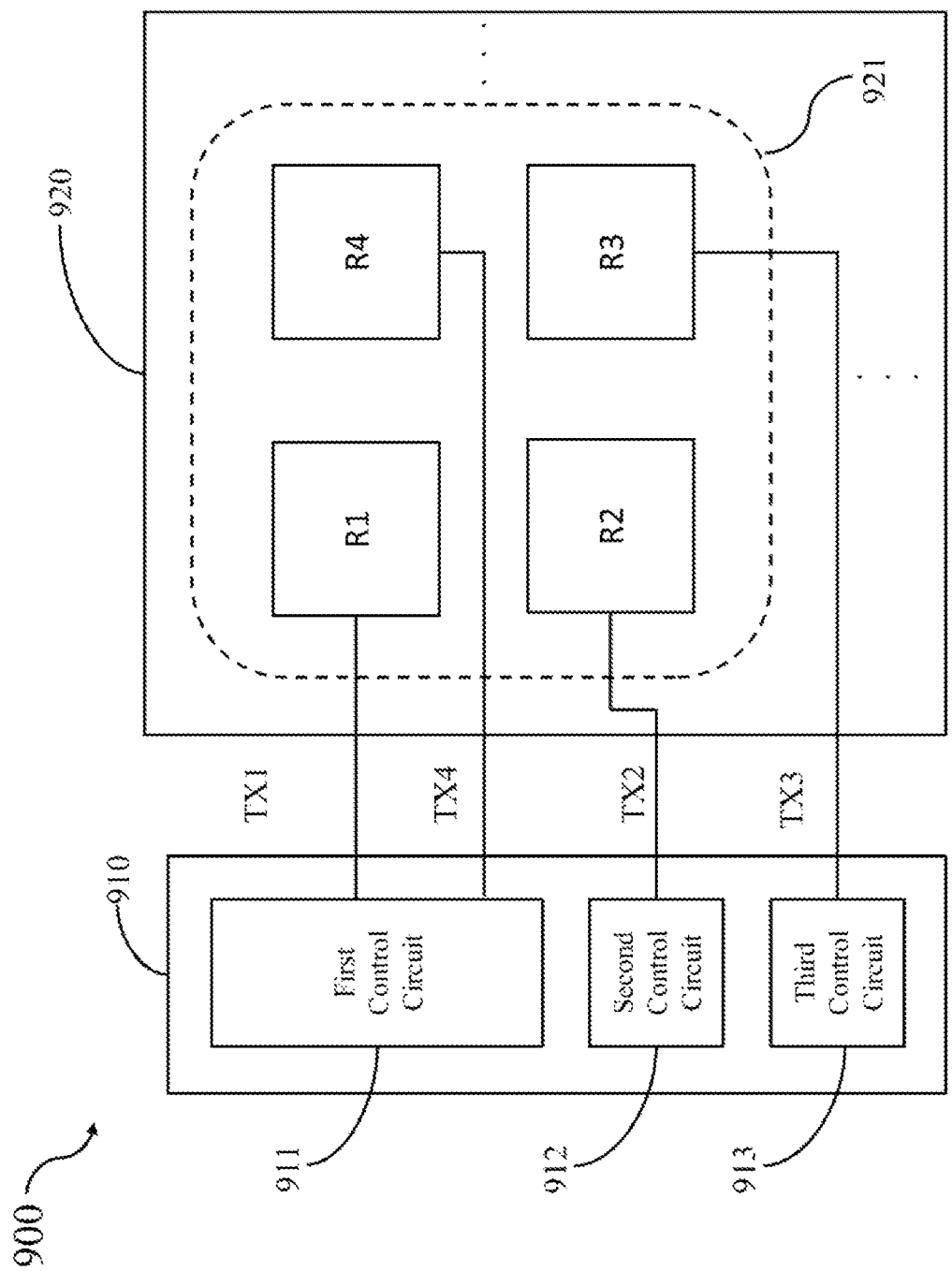
FIG. 9 shows an image sensor circuit according to another embodiment of the present invention.

FIG. 9 shows another embodiment of an image sensor circuit. The image sensor circuit 900 includes at least a driver circuit 910 and a pixel array 920, which is a further derivation of the embodiment shown in FIG. 7. For ease of explanation, FIG. 9 only shows the first pixel circuit group 921. For example, each first pixel circuit group 921 in the pixel array 920 may include a first quantity of pixel circuits R1, a second quantity of pixel circuits R2, a third quantity of pixel circuits R3, and a fourth quantity of pixel circuits R4. In the embodiment of FIG. 9, the first quantity is 1, second quantity is 1, the third quantity is 1, and the fourth quantity is 1. In addition to the first control circuit 911 and the second control circuit 912, the driver circuit 910 also includes a third control circuit 913. The pixel circuit R1 is controlled by the first transmission signal TX1 of the first control circuit 911, the pixel circuit R2 is controlled by the second transmission signal TX2 of the second control circuit 912, the pixel circuit R3 is controlled by the third transmission signal TX3 of the third control circuit 913, and the pixel circuit R4 is controlled by the fourth transmission signal TX4 of the first control circuit 911.

Based on the design of FIG. 9, it can be seen that a pixel circuit in a pixel array 920 is controlled by three control circuits, and four different types of pixel circuits can be determined. Specifically, the first transmission signal TX1 and the fourth transmission signal TX4 are provided by the first control circuit 911, the second transmission signal TX2 is provided by the second control circuit 912, and the third transmission signal TX3 is provided by the third control circuit 913. It should be noted that this embodiment has three control circuits, and therefore can have three different frame rates. The embodiment is intended to express that the driver circuit 910 can be designed to include multiple levels of control circuits. For example, the first control circuit 911 is a high-level control circuit that can generate multiple different transmission signals, while the second control circuit 912 and the third control circuit 913 are simple control circuits that can only generate a single fixed transmission signal. By doing so, the product design can be flexibly configured according to implementation requirements to improve functionality and reduce costs.

Figure 10:
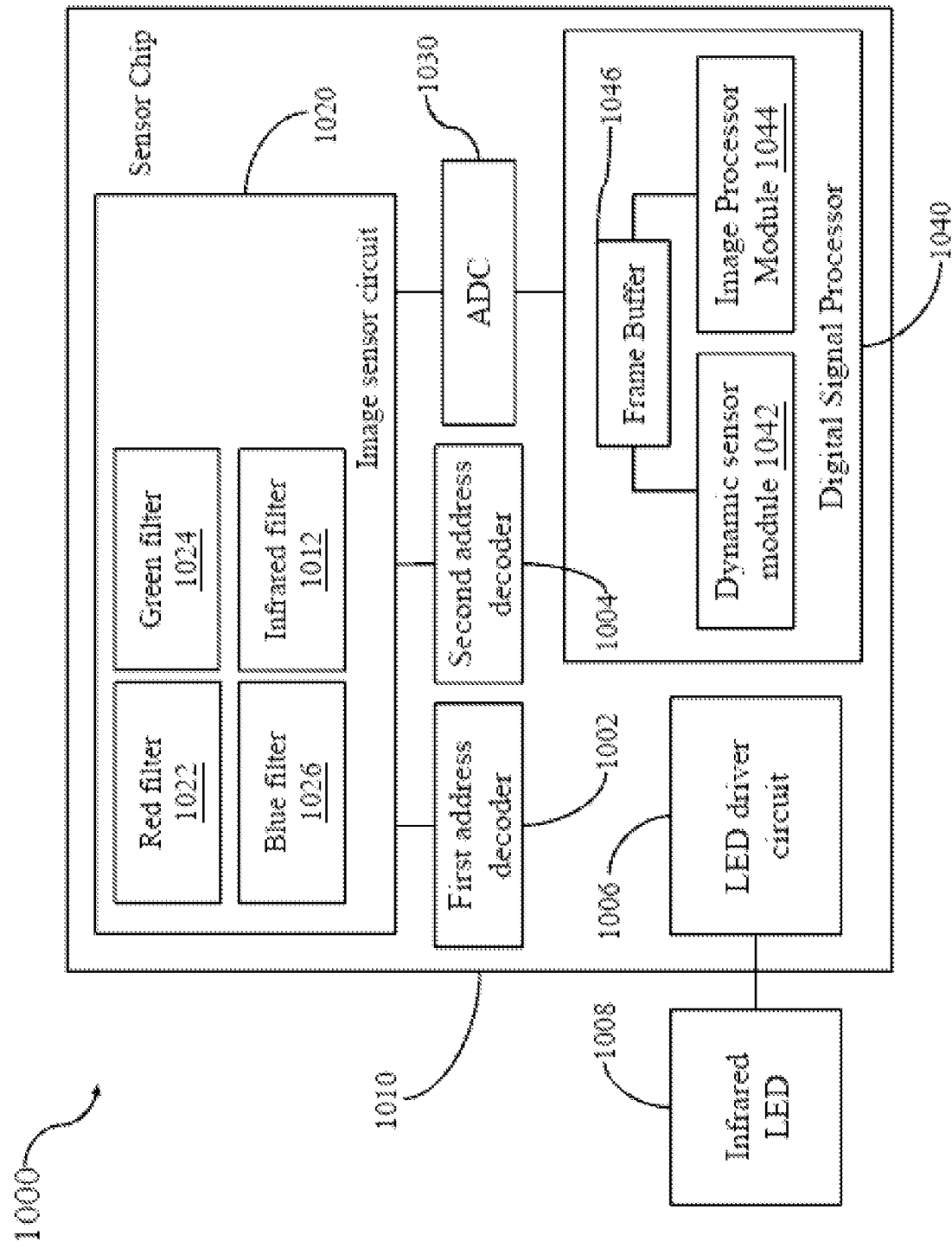
FIG. 10 shows an image sensor device according to an embodiment of the present invention.

FIG. 10 is a structural diagram of an image sensor device 1000 according to an embodiment of the present invention. The image sensor device 1000 in FIG. 10 is derived from the image sensor circuit 100 of the previous embodiment and is adaptable for various applications that require simultaneous detection of motion and image capture or high dynamic range HDR, such as security monitors, car recorders, or electric vehicle autonomous driving systems. The image sensor device 1000 may include an image sensor circuit 1020, which may be designed based on the embodiments of the various image sensor circuits described earlier, and includes a plurality of pixel circuit groups. Each of the pixel circuit groups is covered with distinct types of filters, such as a red filter 1022, a green filter 1024, and a blue filter 1026, for sensing the corresponding visible light range. It can be understood that the wavelength ranges covered by the three primary color filters are different from each other. The image sensor device 1000 may also include a plurality of address decoders, such as the first address decoder 1002 and the second address decoder 1004, as the control circuit mentioned in the previous embodiment. The image sensor device 1000 also includes an ADC 1030 coupled to the image sensor circuit 1020. The original voltage or current signal sensed by the image sensor circuit 1020 is first transmitted to the ADC 1030. The ADC 1030 can convert the signal into digital format and then transmit it to the digital signal processor 1040 for processing. The digital signal processor 1040 can process static image recording and dynamic image sensing functions based on the first and second frame rates, respectively, in conjunction with the first address decoder 1002 and the second address decoder 1004. It can be understood that the first address decoder 1002 and the second address decoder 1004 provide functions equivalent to the control circuit of the embodiments in FIGS. 1 to 9. The digital signal processor 1040 may include a dynamic sensor module 1042 and an image processor module 1044, respectively responsible for distinct types of sensing functions. The dynamic sensor module 1042 can quickly detect dynamic changes in the picture based on the digital data output from the ADC 1030 at the second frame rate. The image processor module 1044 can generate high-quality video images that restore the on-site image quality and color by fusing data of different frame rates based on the second frame rate output from the ADC 1030.

In the embodiment of FIG. 10, the digital signal processor 1040 includes a frame buffer 1046, which is used to temporarily store the digital data output from the ADC 1030. For example, the frame buffer 1046 stores multiple sensed signals. When the dynamic sensor module 1042 performs motion detection, it reads the digital data of two or more consecutive frames from the context of the frame buffer 1046 to perform differential comparison and determine the motion.

In the embodiment of FIG. 10, the frame buffer 1046 in the digital signal processor 1040 can be used to store the previous image, which can be used as a basis for comparison when the signal of the second image comes in. In general, the method for detecting motion in DVS is to subtract the two consecutive frames, so the ADC 1030 can store the signals of the first and second frames in the frame buffer 1046, and then the motion sensor module 1042 reads the signals of the first and second frames from the frame buffer 1046 and performs subtraction to detect the dynamic changes.

When generating a video image, the image processor module 1044 reads the digital data generated by the multiple pixel circuits corresponding to a pixel from the frame buffer 1046, and performs a specific fusion algorithm based on the parameters of each pixel circuit, such as exposure duration, gain value, or weighting coefficient, to fuse the digital data into the image value of the pixel. Because the video image generated by the image processor module 1044 is obtained by fusing the information of all pixel circuits, the spatial resolution is lossless, that is, the fused image has completed spatial resolution, so there is no problem of reduced image quality. In the embodiment of the present invention, the video signal with RGB format and the infrared motion signal DVS(IR) are generated on the same chip, and the two signals can be fused in the same chip.

In further embodiments, to enhance acquisition of infrared images by the image sensor circuit 1020, the image sensor device 1000 may further include an LED driver circuit 1006, which is coupled to an infrared LED 1008 for illuminating the target space or object. The actual design of the image sensor device 1000 can be flexible and may vary depending on the application scenario. The description of FIG. 10 is provided for illustration purposes only and is not intended to be limiting.

Figure 11:
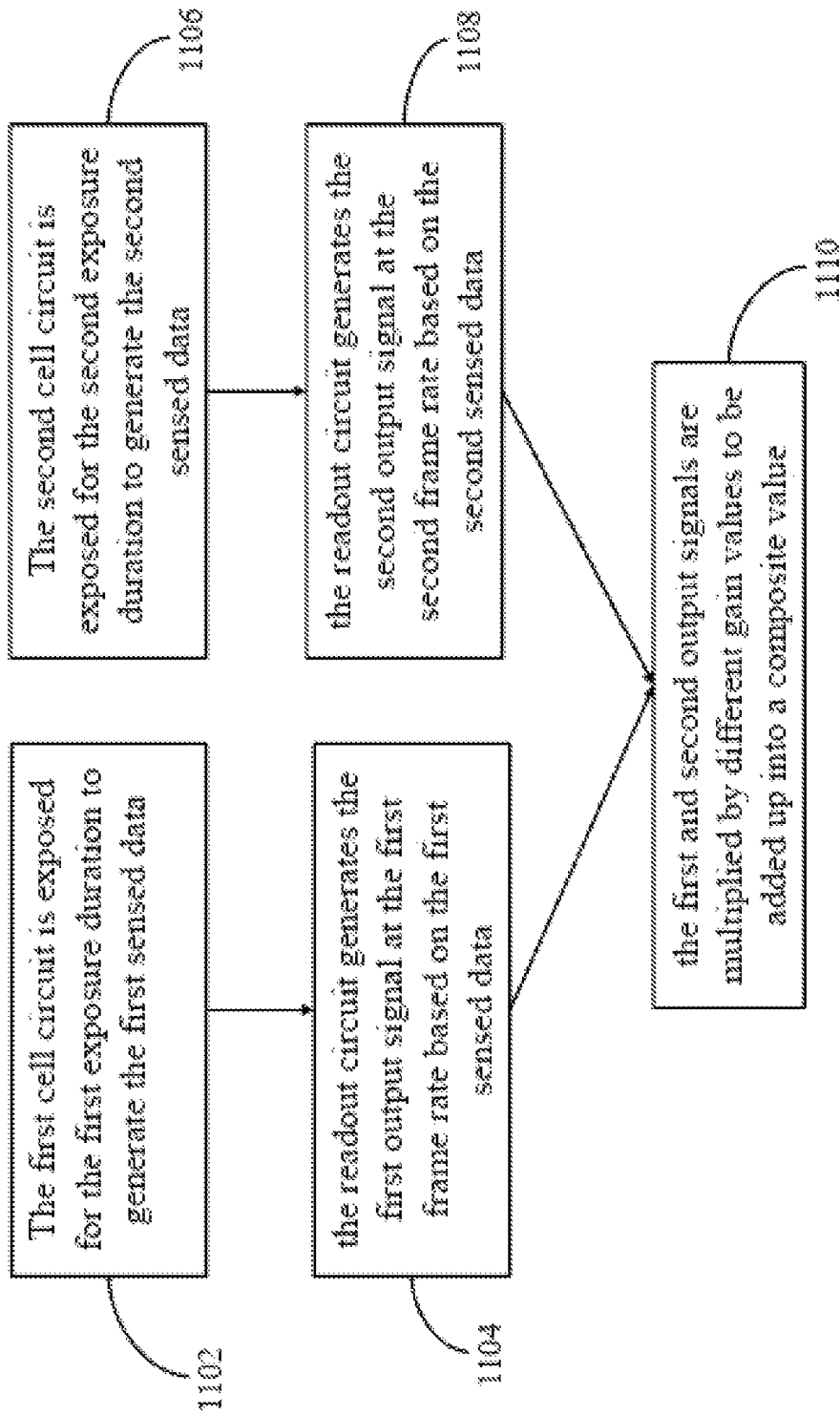
FIG. 11 shows an image sensing method according to an embodiment of the present invention.

FIG. 11 shows an operational example of the image sensor circuit according to the present invention. The operation of the control circuit in the image sensor circuits of FIGS. 1-10 can be summarized in the following steps. In step 1102, the first control circuit controls the first pixel circuit to expose for the first exposure duration and generate the first sensed data. In step 1104, the first control circuit controls the readout circuit to generate the first output signal at the first frame rate based on the first sensed data. In step 1106, the second control circuit controls the second pixel circuit to expose for the second exposure duration and generate the second sensed data. In step 1108, the second control circuit controls the readout circuit to generate the second output signal at the second frame rate based on the second sensed data. Finally, the image sensor circuit of the present invention can also fuse the signals into a final image using a specific algorithm in step 1110. For example, the algorithm can multiply the first and second output signals by different gain values based on the first and second exposure durations and the first and second frame rates, and then add them together to generate a composite value. The operation of the composite value can be flexibly adjusted based on implementation requirements to optimize the output performance of each image pixel in various application scenarios.

In a further embodiment, the pixel circuit groups in the pixel array 120 of FIG. 1 or the pixel array 1020 of FIG. 10 can be arranged in a Group Bayer Pattern.

In a further embodiment, the pixel circuit groups in the pixel array 120 of FIG. 1 or the pixel array 1020 of FIG. 10 can be arranged using a 2×2 shared floating diffusion node (2×2 share FD) configuration.

In a further embodiment, the first control circuit in FIG. 1 may include a first address decoder for controlling the first frame rate. The second control circuit 114 in FIG. 1 may include a second address decoder for controlling the second frame rate. The first frame rate and the second frame rate may operate asynchronously. Other embodiments, such as the controllers in FIG. 2 and FIGS. 4-9, may also be implemented analogously.

It should be noted that herein the terms "comprising" and "including" or any other variations thereof are intended to cover non-exclusive inclusions so that a process, method, article or device comprising a series of elements comprises not only those elements, but also other elements not expressly listed, or also comprises elements inherent in such process, method, article or device. In the absence of further restrictions, the statement "comprises a . . . " does not exclude the existence of other identical elements in the process, method, article or device comprising the element.

The embodiments of the present invention are described above in combination with the drawings, but the present invention is not limited to the specific embodiments described above, the above specific embodiments are only illustrative, not restrictive, and the usual knowledge of the technical field is inspired by the present invention, and does not depart from the purpose of the present invention Under the scope of protection of the patent scope of the invention, many forms can be made, all of which are within the protection of the application.

What is claimed is:

1. An image sensor circuit, comprising:
   a pixel array, configured to sense light and generate an image data, and comprising a plurality of pixel circuit groups arranged in an array, wherein each of the pixel circuit groups comprises a plurality of pixel circuits configured to generate corresponding photo-sensed values over exposure durations; wherein the plurality of pixel circuits are configured to comprise a first quantity of first pixel circuits and a second quantity of second pixel circuits; and
   a driver circuit, coupled to the pixel array for driving the pixel array and comprising:
      a first control circuit, coupled to the first pixel circuits and configured to transmit a first transmission signal to control a first exposure duration of the first pixel circuits, and output a first photo-sensed value at a first frame rate; and
      a second control circuit, coupled to the second pixel circuits and configured to transmit a second transmission signal to control a second exposure duration of the second pixel circuits, and output a second photo-sensed value at a second frame rate;
   wherein:
   the second frame rate is higher than the first frame rate; and
   the image sensor circuit periodically generates pixel values of each pixel circuit group based on the first exposure duration, the second exposure duration, the first frame rate, the second frame rate, the first photo-sensed value, and the second photo-sensed value.

2. An image sensor circuit according to claim 1, wherein:
   when the image sensor circuit generates pixel values of each pixel circuit group, the plurality of photo-sensed values generated by the first pixel circuits are respectively multiplied by predetermined weight coefficients to be added up to generate the first photo-sensed value, and the plurality of photo-sensed values generated by the second pixel circuits are respectively multiplied by predetermined weight coefficients to be added up to generate the second photo-sensed value.

3. The image sensor circuit according to claim 1, further comprising:
   a readout circuit, coupled to each of the pixel circuit groups, configured to read photo-sensed values from each of the pixel circuits;
   wherein the first control circuit and the second control circuit are arranged to alternatively control the readout circuit through a reset signal, allowing the readout circuit to generate a readout signal based on the photo-sensed values of the pixel circuits.

4. The image sensor circuit according to claim 2, wherein:
   the readout circuit comprises a ramp capacitor, a first end of the ramp capacitor is coupled to each of the pixel circuits through a floating diffusion node, and a second end of the ramp capacitor is coupled to a ramp voltage; and
   the readout circuit is controlled by a scan signal to couple a signal from the ramp voltage through the ramp capacitor to the floating diffusion node in a specific timing sequence, and converts a potential of the floating diffusion node into the readout signal.

5. The image sensor circuit according to claim 3, wherein:
   each of the pixel circuits in the pixel array comprises:
      a photodiode configured to accumulate charges in response to light; and
      a switch circuit, coupled to the photodiode and the floating diffusion node, and controllable by the driver circuit to change a conductive state; wherein:
   when the first control circuit transmits a first transmission signal to turn on the switch circuit in the first pixel circuits and transmits a reset signal to couple the switch circuit to a reset voltage, the charges accumulated in the photodiodes in the first pixel circuits are reset; and
   when the first control circuit transmits the first transmission signal to turn on the switch circuit but does not transmit the reset signal, the charges accumulated in the photodiodes in the first pixel circuits are stored to the floating diffusion node.

6. The image sensor circuit according to claim 1, wherein:
   the driver circuit further comprises a third control circuit, coupled to the pixel circuits, configured to transmit a third transmission signal to expose a third quantity of third pixel circuits in the pixel array for a third exposure duration;
   the third control circuit is also configured to control the third pixel circuits to output a third photo-sensed value at a third frame rate; and
   the image sensor circuit periodically generates pixel values of each pixel circuit group based on the first exposure duration, the second exposure duration, the third exposure duration, the first frame rate, the second frame rate, the third frame rate, the first photo-sensed value, the second photo-sensed value, and the third photo-sensed value of the pixel circuits in each pixel circuit group.

7. The image sensor circuit according to claim 1, wherein a plurality of pixel circuit groups in the pixel array are arranged in a group Bayer array.

8. The image sensor circuit according to claim 1, wherein a plurality of pixel circuit groups in the pixel array are arranged in a 2×2 shared floating diffusion manner.

9. The image sensor circuit according to claim 1, wherein:
   the first control circuit comprises a first address decoder for controlling the first frame rate;
   the second control circuit comprises a second address decoder for controlling the second frame rate; and
   the first frame rate and the second frame rate are asynchronized.

10. The image sensor circuit according to claim 1, wherein the first exposure duration is greater than a duration of a frame operated in the second frame rate.

11. An image sensor device for motion detection and image capture, comprising:
    an image sensor circuit, comprising:
       a pixel array, configured to sense light and generate an image data and comprising a plurality of pixel circuit groups arranged in an array, wherein each of the pixel circuit groups comprises a plurality of pixel circuits configured to generate corresponding photo-sensed values over exposure durations; wherein the plurality of pixel circuits are configured to comprise a first quantity of first pixel circuits, and a second quantity of second pixel circuits; and
       a driver circuit, coupled to the pixel array for driving the pixel array and comprising:
          a first control circuit, coupled to the first pixel circuits and configured to transmit a first transmission signal to control a first exposure duration of the first pixel circuits, and output a first photo-sensed value at a first frame rate; and a second control circuit, coupled to the second pixel circuits and configured to transmit a second transmission signal to control a second exposure duration of the second pixel circuits, and output a second photo-sensed value at a second frame rate;

wherein:

the second frame rate is higher than the first frame rate; and the image sensor circuit periodically generates pixel values of each pixel circuit group based on the first exposure duration, the second exposure duration, the first frame rate, the second frame rate, the first photo-sensed value, and the second photo-sensed value;

a plurality of red filters, green filters, and blue filters respectively covering the first pixel circuits and the second pixel circuits;

an analog-to-digital converter coupled to the image sensor circuit, capable of converting the pixel values output from the first pixel circuits into a first digital signal, and converting the pixel values output from the second pixel circuits into a second digital signal;

an image processor module, coupled to the analog-to-digital converter, and capable of generating the image data based on the first digital signal; and a dynamic sensor module, coupled to the analog-to-digital converter and capable of detecting object motions based on the second digital signal.

12. The image sensor device as claimed in claim 11, wherein the image sensor circuit further comprises a frame buffer for buffering the first and second digital signals output from the analog-to-digital converter.

13. The image sensor device according to claim 11, further comprising:

a readout circuit, coupled to each of the pixel circuit groups, and configured to read the photo-sensed values from each of the pixel circuits, wherein the first control circuit and the second control circuit are arranged to alternatively control the readout circuit through a reset signal, allowing the readout circuit to generate a readout signal based on the photo-sensed values of the pixel circuits.

14. The image sensor device according to claim 12, wherein:

the readout circuit comprises a ramp capacitor, a first end of the ramp capacitor is coupled to each of the pixel circuits through a floating diffusion node, and a second end of the ramp capacitor is coupled to a ramp voltage; and the readout circuit is controlled by a scan signal to couple a signal from the ramp voltage through the ramp capacitor to the floating diffusion node in a specific timing sequence, and converts a potential of the floating diffusion node into the readout signal.

15. The image sensor device according to claim 13, wherein:

each of the pixel circuits in the pixel array comprises:

a photodiode configured to accumulate charges in response to light; and a switch circuit, coupled to the photodiode and the floating diffusion node, and controllable by the driver circuit to change a conductive state, wherein:

when the first control circuit transmits a first transmission signal to turn on the switch circuit in the first pixel circuits and transmits a reset signal to couple the switch circuit to a reset voltage, the charges accumulated in the photodiodes in the first pixel circuits are reset; and when the first control circuit transmits the first transmission signal to turn on the switch circuit but does not transmit the reset signal, the charges accumulated in the photodiodes in the first pixel circuits are stored to the floating diffusion node.

16. The image sensor device according to claim 11, wherein:

the driver circuit further comprises a third control circuit, coupled to the pixel circuits and configured to transmit a third transmission signal to expose a third quantity of third pixel circuits in the pixel array for a third exposure duration;

the third control circuit is also configured to control the third pixel circuits to output a third photo-sensed value at a third frame rate; and the image sensor circuit periodically generates pixel values of each pixel circuit group based on the first exposure duration, the second exposure duration, the third exposure duration, the first frame rate, the second frame rate, the third frame rate, the first photo-sensed value, the second photo-sensed value, and the third photo-sensed value of the pixel circuits in each pixel circuit group.

17. The image sensor device according to claim 11, wherein a plurality of pixel circuit groups in the pixel array are arranged in a group Bayer array.

18. The image sensor device according to claim 11, wherein a plurality of pixel circuit groups in the pixel array are arranged in a 2×2 shared floating diffusion manner.

19. The image sensor device according to claim 11, wherein:

the first control circuit comprises a first address decoder for controlling the first frame rate;

the second control circuit comprises a second address decoder for controlling the second frame rate; and the first frame rate and the second frame rate are asynchronized.

20. The image sensor device according to claim 11, wherein the first exposure duration is greater than a duration of a frame operated in the second frame rate.

* * * * *